(12) United States Patent
Cai et al.

(10) Patent No.: US 10,757,812 B1
(45) Date of Patent: Aug. 25, 2020

(54) CHIP DOUBLE-SIDED LAYOUT ON PCB

(71) Applicant: NVIDIA Corporation, Santa Clara, CA (US)

(72) Inventors: Joey Cai, Shenzhen (CN); Tiger Yan, Shenzhen (CN); Oliver Yi, Shenzhen (CN); Jacky Zhu, Shenzhen (CN); Roman Li, Shenzhen (CN)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 16/510,780

(22) Filed: Jul. 12, 2019

(30) Foreign Application Priority Data

May 23, 2019 (CN) .......................... 2019 1 0434472

(51) Int. Cl.
*H05K 5/00* (2006.01)
*H05K 1/18* (2006.01)
*H05K 1/11* (2006.01)
*H05K 3/30* (2006.01)

(52) U.S. Cl.
CPC .............. *H05K 1/181* (2013.01); *H05K 1/115* (2013.01); *H05K 3/303* (2013.01); *H05K 5/00* (2013.01); *H05K 2201/1053* (2013.01); *H05K 2201/10522* (2013.01); *H05K 2201/10734* (2013.01)

(58) Field of Classification Search
None
See application file for complete search history.

(56) References Cited

U.S. PATENT DOCUMENTS

| | | | | |
|---|---|---|---|---|
| 7,233,061 B1* | 6/2007 | Conn | ...................... | H01L 23/66 257/686 |
| 9,515,025 B2* | 12/2016 | Rogers | ................ | H01L 27/1266 |
| 10,234,960 B1* | 3/2019 | Bharadwaj | ............ | G06F 3/0216 |
| 2005/0280146 A1* | 12/2005 | Cornelius | ............... | H01L 24/13 257/730 |
| 2007/0025091 A1* | 2/2007 | Shimada | ................ | H05K 3/387 361/750 |
| 2009/0197436 A1* | 8/2009 | Trobough | .......... | H01R 13/2442 439/67 |
| 2016/0259738 A1* | 9/2016 | Johnson | ................. | H05K 1/189 |

* cited by examiner

*Primary Examiner* — Courtney L Smith
*Assistant Examiner* — Rashen E Morrison
(74) *Attorney, Agent, or Firm* — Zilka-Kotan, P.C.

(57) ABSTRACT

The present invention provides a printed circuit board and a layout method thereof and an electronic equipment. On the printed circuit board is arranged a first processor chip and a second processor chip, wherein the first processor chip is arranged on a first surface of the printed circuit board; the second processor chip is arranged on a second surface of the printed circuit board; and a first through-hole is disposed on the printed circuit board, part of pins of the first processor chip being connected to part of pins of the second processor chip via the first through-hole. The printed circuit board, the layout method thereof and the electronic equipment provided in the present invention arrange two processor chips on different surfaces of the printed circuit board and enable the respective parts of pins of the two processor chips to pass through the printed circuit board to be connected with each other by providing a through-hole on the printed circuit board, which not only greatly saves the space on the printed circuit board and is beneficial to product miniaturization, but also reduces transmission loss of high speed circuit and component costs.

11 Claims, 4 Drawing Sheets

CHIP DOUBLE-SIDED LAYOUT ON PCB

CROSS-REFERENCE TO RELATED APPLICATION

This application is related to the following which is being incorporated herein by reference in its entirety for all purposes: Chinese Patent Application No. 201910434472.0, filed May 23, 2019, entitled "CHIP DOUBLE-SIDED LAYOUT ON PCB."

BACKGROUND

The present invention relates to the technical field of a printed circuit board, and particularly to the printed circuit board and a layout method thereof and an electronic equipment.

On a conventional printed circuit board with two processor chips, the two processor chips are both generally arranged on the same surface of the printed circuit board, which usually occupies large space of the printed circuit board on the surface. In addition, a bridge chip typically needs to be used between the two processor chips for transmitting signals therebetween. On the one hand, the bridge chip also occupies a large space of the printed circuit board, and on the other, the adding of the bridge chip increases the cost of components. Additionally, traces between the two processor chips may produce transmission loss of high speed circuit.

Accordingly, the layout method for the printed circuit board comprising two or more processor chips requires improvement.

SUMMARY

The present invention is proposed to solve the above problem. According to one aspect of the present invention, a printed circuit board is provided, on which a first processor chip and a second processor chip are arranged, wherein: the first processor chip is arranged on a first surface of the printed circuit board; the second processor chip is arranged on a second surface of the printed circuit board; and a first through-hole is disposed on the printed circuit board, part of pins of the first processor chip being connected to part of pins of the second processor chip via the first through-hole.

In one embodiment of the present invention, the first processor chip and the second processor chip are arranged to overlap each other on the first surface and the second surface.

In one embodiment of the present invention, the first processor chip and the second processor chip are chips of the same type.

In one embodiment of the present invention, the first processor chip and the second processor chip are both central processing unit chips, or the first processor chip and the second processor chip are both graphics processing unit chips.

In one embodiment of the present invention, the first processor chip and the second processor chip are chips of different types.

In one embodiment of the present invention, one of the first processor chip and the second processor chip is a central processing unit chip, and the other is a graphics processing unit chip.

In one embodiment of the present invention, the remaining part of pins of the first processor chip and the remaining part of pins of the second processor chip are both connected to the printed circuit board based on a Ball Grid Array (BGA).

In one embodiment of the present invention, on the printed circuit board is further arranged a third processor chip and a first bridge chip, wherein: the third processor chip and the first bridge chip are arranged on the first surface of the printed circuit board; the third processor chip is connected to the first processor chip via the first bridge chip and connected to the second processor chip via the first processor chip.

In one embodiment of the present invention, on the printed circuit board is further arranged a fourth processor chip and a second bridge chip, wherein: the fourth processor chip and the second bridge chip are arranged on the second surface of the printed circuit board; a second through-hole is disposed on the printed circuit board, part of pins of the third processor chip being connected to part of pins of the fourth processor chip via the second through-hole; the fourth processor chip is connected to the second processor chip via the second bridge chip and connected to the first processor chip via the second processor chip.

According to another aspect of the present invention, a layout method of the printed circuit board is provided, the layout method comprising: arranging a first processor chip on a first surface of the printed circuit board; arranging a second processor chip on a second surface of the printed circuit board; and disposing a first through-hole on the printed circuit board, part of pins of the first processor chip being connected to part of pins of the second processor chip via the first through-hole.

In one embodiment of the present invention, the layout method further comprises: arranging the first processor chip and the second processor chip to overlap each other on the first surface and the second surface.

In one embodiment of the present invention, the layout method further comprises: the remaining part of pins of the first processor chip and the remaining part of pins of the second processor chip both being configured to be connected to the printed circuit board based on a Ball Grid Array (BGA).

In one embodiment of the present invention, the layout method further comprises: arranging a third processor chip and a first bridge chip on the first surface of the printed circuit board; connecting the third processor chip to the first processor chip via the first bridge chip and to the second processor chip via the first processor chip.

In one embodiment of the present invention, the layout method further comprises: arranging a fourth processor chip and a second bridge chip on the second surface of the printed circuit board; disposing a second through-hole on the printed circuit board, part of pins of the third processor chip being connected to part of pins of the fourth processor chip via the second through-hole; connecting the fourth processor chip to the second processor chip via the second bridge chip and to the first processor chip via the second processor chip.

According to still another aspect of the present invention, an electronic equipment is further provided, the electronic equipment comprising the printed circuit board of any one of the above claims.

The printed circuit board and the layout method thereof and the electronic equipment provided in the present invention arrange two processor chips on different surfaces of the printed circuit board and enable the respective parts of pins of the two processor chips to pass through the printed circuit board to be connected with each other by disposing through-holes on the printed circuit board, which not only greatly saves the space on the printed circuit board and is beneficial to product miniaturization, but also reduces transmission loss of high speed circuit and component costs.

BRIEF DESCRIPTION OF THE DRAWINGS

The following drawings are hereby incorporated as part of the present invention for the understanding of the present invention. The drawings illustrate embodiments and description for explaining the principle of the present invention.

In the drawings.

DETAILED DESCRIPTION

In the following description, numerous specific details are set forth in order to provide a more thorough understanding of the present invention. However, it is obvious to those skilled in this art that the present invention may be implemented without one or more of these details. Some technical features well-known in this art are not described in other examples so as not to confuse with the present invention.

It is to be understood that the present invention can be implemented in various forms but should not be construed as being limited to the embodiments set forth herein. On the contrary, these embodiments are provided to make the disclosure thorough and complete and the scope of the invention be completely delivered to those skilled in the art.

The use of the terms provided herein is intended merely to illuminate the embodiments and does not pose a limitation on the invention. When they are used herein, the terms "a", "an" and "the" in the singular form are also intended to include the plural, unless otherwise indicated herein. It should still be understood that the terms "comprising" and/or "including" are used in the description to determine the presence of the features, integers, steps, operations, elements and/or components but not to exclude the presence or addition of one or more other features, integers, steps, operations, elements, components and/or groups. When they are used herein, the terms "and/or" include any or all combinations of related listed items.

In order to understand the present invention thoroughly, a detailed step and structure is provided in the following description so as to elucidate the technical solutions presented in the present invention. Better embodiments of the present invention are illustrated in detail as below. However, the present invention may further have other embodiments in addition to these detailed description.

Figure 1:
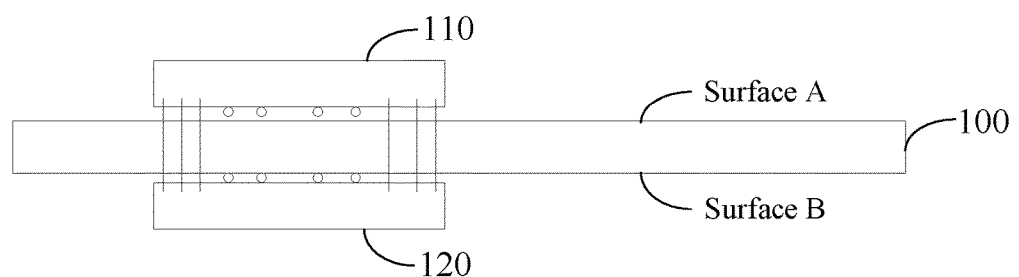
FIG. 1 illustrates an exemplary structure block diagram of a printed circuit board according to one embodiment of the present invention.

FIG. 1 illustrates an exemplary structure block diagram of a printed circuit board 100 according to one embodiment of the present invention. As shown in FIG. 1, on the printed circuit board 100 is arranged a first processor chip 110 and a second processor chip 120. Wherein, the first processor chip 110 is arranged on a first surface (Surface A as shown in FIG. 1) of the printed circuit board 100. The second processor chip 120 is arranged on a second surface (Surface B as shown in FIG. 1) of the printed circuit board 100. In addition, a first through-hole is disposed on the printed circuit board 100. Part of pins of the first processor chip 100 are connected to part of pins of the second processor chip 120 via the first through-hole, as illustrated by the vertical lines connected between the first processor chip 110 and the second processor chip 120 in FIG. 1.

In the embodiment of the present invention, the first processor chip 110 and the second processor chip 120 may be chips of the same type or of different types. In one example, the first processor chip 110 and the second processor chip 120 both may be central processing unit (CPU) chips. In another example, the first processor chip 110 and the second processor chip 120 both may be graphics processing unit (GPU) chips. In still another example, the first processor chip 110 may be a central processing unit chip, and the second processor chip 120 may be a graphics processing unit chip. In still yet another example, the first processor chip 110 may be a graphics processing unit chip, and the second processor chip 120 may be a central processing unit chip. In other examples, the first processor chip 110 and the second processor chip 120 may further be any other processor chips.

In a word, when two processor chips need to be arranged on a printed circuit board, they may be arranged on different surfaces of the printed circuit board (e.g. on the front and back surfaces, referred to as front and back stacked layout technology), which therefore effectively saves space on the printed circuit board (e.g. it can save about 25%-50% space on the printed circuit board). It is beneficial for miniaturization development of the printed circuit board and even the electronic equipment comprising the same, and can also help cost down the printed circuit board and expand the range of application thereof.

In the embodiment of the present invention, on the printed circuit board 100 is arranged a first through-hole which pierces the entire printed circuit board. The first processor chip 110 and the second processor chip 120 may be connected to each other via the first through-hole. Exemplarily, the first processor chip 110 and the second processor chip 120 are connected to each other via the first through-hole by only using the respective parts of pins. Wherein, the "part of pins" of the first processor chip 110 and the "part of pins" of the second processor chip 120 are the parts of pins between the first processor chip 110 and the second processor chip 120 which need to be connected for realizing interaction with each other. Exemplarily, on the printed circuit board 100 is arranged a plurality of first through-holes. The part of pins of the first processor chip 110 (connected to the second processor chip 120) each is connected to the respective one of the part of pins of the second processor chip 120 (connected to the first processor chip 110) via one first through-hole. Correspondingly, the part of pins of the second processor chip 120 (connected to the first processor chip 110) each is connected to the respective one of the part of pins of the first processor chip 110 (connected to the second processor chip 120) via one first through-hole. The first processor chip 110 and the second processor chip 120 are connected therebetween via the pins such that transmission loss of the high speed circuit is greatly reduced.

The remaining part of pins of the first processor chip 110 (not connected to the second processor chip 120) and the remaining part of pins of the second processor chip 120 (not connected to the first processor chip 110) are all connected to the printed circuit board 100 based on a Ball Grid Array (BGA) (as shown by small circles in FIG. 1) or by use of other suitable manners.

The first processor chip 110 and the second processor chip 120 are connected therebetween via the pins, without need of connecting to each other by use of a bridge chip as arranged on a conventional printed circuit board, such that such a component as the bridge chip is not required to be arranged on the printed circuit board provided with two processor chips, thereby reducing the component cost.

Further, in the embodiment of the present invention, the first processor chip 110 and the second processor chip 120 may be arranged to completely overlap each other on the first surface and the second surface. That is to say, assuming that the first surface is a front surface of the printed circuit board 100 and the second surface is a back surface thereof, the ligature between the first processor chip 110 and the second processor chip 120 (if they are the same in size) is simultaneously perpendicular to the Surface A and Surface B of the printed circuit board 100, as seen from the side view of the printed circuit board 100 (i.e. the perspective as shown in FIG. 1). One advantage of doing so is that there is the shortest distance for the connection between the first processor chip 110 and the second processor chip 120, and the interaction and communication therebetween have the least loss. Alternatively, the first processor chip 110 and the second processor chip 120 may be arranged to partially overlap each other on the first surface and the second surface. Alternatively, the first processor chip 110 and the second processor chip 120 may also be arranged on the first surface and the second surface without overlap, which depends on the specific requirements for the layout on the printed circuit board.

Based on the above demonstration, the printed circuit board according to embodiments of the present invention arranges two processor chips on different surfaces of the printed circuit board and enable the respective parts of pins of the two processor chips to pass through the printed circuit board to be connected to each other by disposing through-holes on the printed circuit board, which not only greatly saves the space on the printed circuit board and is beneficial to product miniaturization, but also reduces transmission loss of high speed circuit and component costs.

Further, on the printed circuit board according to the embodiments of the present invention is further arranged a third processor chip and a first bridge chip, wherein: the third processor chip and the first bridge chip are arranged on the first surface of the printed circuit board; the third processor chip is connected to the first processor chip via the first bridge chip and connected to the second processor chip via the first processor chip. Further, on the printed circuit board according to the embodiments of the present invention is further arranged a fourth processor chip and a second bridge chip, wherein: the fourth processor chip and the second bridge chip are arranged on the second surface of the printed circuit board; a second through-hole is disposed on the printed circuit board, the part of pins of the third processor chip being connected to the part of pins of the fourth processor chip via the second through-hole; the fourth processor chip is connected to the second processor chip via the second bridge chip and connected to the first processor chip via the second processor chip. The above two embodiments are respectively depicted by referring to FIGS. 2 and 3 below.

Figure 2:
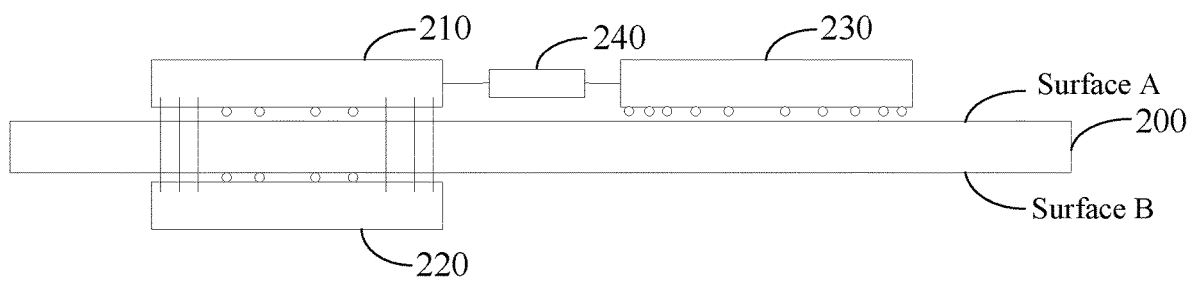
FIG. 2 illustrates an exemplary structure block diagram of a printed circuit board according to another embodiment of the present invention.

FIG. 2 illustrates an exemplary structure block diagram of a printed circuit board 200 according to another embodiment of the present invention. As shown in FIG. 2, on the printed circuit board 200 is arranged a first processor chip 210 and a second processor chip 220. Wherein, the first processor chip 210 is arranged on a first surface (Surface A as shown in FIG. 2) of the printed circuit board 200. The second processor chip 220 is arranged on a second surface (Surface B as shown in FIG. 2) of the printed circuit board 200. In addition, a first through-hole is disposed on the printed circuit board 200, part of pins of the first processor chip 210 being connected to part of pins of the second processor chip 220 via the first through-hole. Additionally, on the printed circuit board 200 is further arranged a third processor chip 230 and a first bridge chip 240, wherein: the third processor chip 230 and the first bridge chip 240 are arranged on the first surface of the printed circuit board 200; the third processor chip 230 is connected to the first processor chip 210 via the first bridge chip 240 and connected to the second processor chip 220 via the first processor chip 210.

The first processor chip 210, the second processor chip 220 and the layout thereof in the embodiment as shown in FIG. 2 are respectively similar to the first processor chip 110, the second processor chip 120 and the layout thereof in the embodiment as shown in FIG. 1, which will not be repeated here for simplicity. Different from the embodiment as shown in FIG. 1, in the embodiment as shown in FIG. 2, on the printed circuit board 200 is further arranged a third processor chip 230 and a first bridge chip 240. Wherein, the third processor chip 230 may be a chip of the same type as the first processor chip 210 and the second processor chip 220, and may also be a chip of different type from the first processor chip 210 and the second processor chip 220. Since the third processor chip 230 and the first processor chip 210 are arranged on the same surface, they are connected and interacted via the first bridge chip 240. While the first processor chip 210 and the second processor chip 220 are respectively arranged on different surfaces of the printed circuit board and directly connected via each other's pins, and therefore, the third processor chip 230 may be connected and interacted with the second processor chip 220 via the first processor chip 210.

It is herein to be understood that, although the third processor chip 230 is arranged on the same surface of the printed circuit board 200 with the first processor chip 210 in the embodiment as shown in FIG. 2, the third processor chip 230 may further be arranged on the same surface of the printed circuit board 200 with the second processor chip 220. Whereupon, the first bridge chip 240 may be arranged on a second surface (Surface B) of the printed circuit board 200 such that the third processor chip 230 is connected and interacted with the second processor chip 220 via the first bridge chip 240, and connected and interacted with the first processor chip 210 via the second processor chip 220.

In this embodiment, on the printed circuit board are arranged three processor chips. In this case, two processor chips may be arranged on two surfaces of the printed circuit board, and simultaneously another one processor chip is arranged on the surface where any one of the previous two processor chips is arranged. Meanwhile, the bridge chip is arranged to be connected and interacted with the processor chip on the same surface, which can thus realize interconnection among the three processor chips (including direct connection and indirect connection) and interaction, and save space on the printed circuit board as far as possible and reduce transmission loss of high speed circuit.

Figure 3:
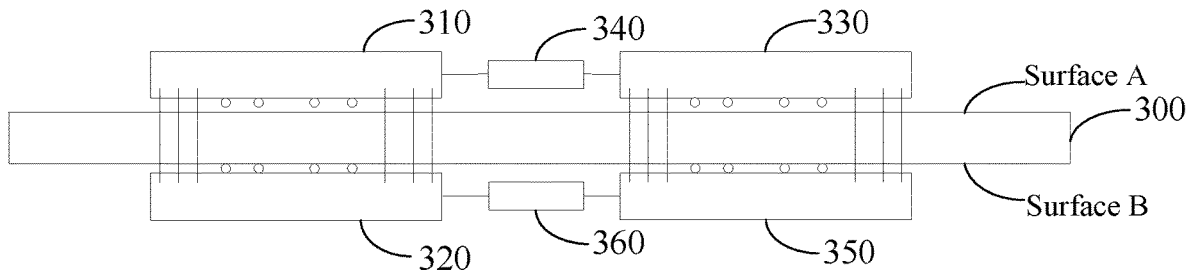
FIG. 3 illustrates an exemplary structure block diagram of a printed circuit board according to still another embodiment of the present invention.

FIG. 3 illustrates an exemplary structure block diagram of a printed circuit board 300 according to still another embodiment of the present invention. As shown in FIG. 3, on the printed circuit board 300 is arranged a first processor chip 310 and a second processor chip 320. Wherein, the first processor chip 310 is arranged on a first surface (Surface A as shown in FIG. 3) of the printed circuit board 300. The second processor chip 320 is arranged on a second surface (Surface B as shown in FIG. 3) of the printed circuit board 300. In addition, a first through-hole is disposed on the printed circuit board 300, part of pins of the first processor chip 310 being connected to part of pins of the second processor chip 320 via the first through-hole. Additionally, on the printed circuit board 300 is further arranged a third processor chip 330 and a first bridge chip 340, wherein: the third processor chip 330 and the first bridge chip 340 are arranged on the first surface of the printed circuit board 300; the third processor chip 330 is connected to the first processor chip 310 via the first bridge chip 340 and connected to the second processor chip 320 via the first processor chip 310. In addition, on the printed circuit board 300 is further arranged a fourth processor chip 350 and a second bridge chip 360, wherein: the fourth processor chip 350 and the second bridge chip 360 are arranged on the second surface of the printed circuit board 300; on the printed circuit board 300 is further arranged a second through-hole, part of pins of the third processor chip 330 being connected to part of pins of the fourth processor chip 350 via the second through-hole; the fourth processor chip 350 is connected to the second processor chip 320 via the second bridge chip 360 and connected to the first processor chip 310 via the second processor chip 320.

The first processor chip 310, the second processor chip 320, the third processor chip 330 and the layout thereof in the embodiment as shown in FIG. 3 are respectively similar to the first processor chip 210, the second processor chip 220, the third processor chip 230 and the layout thereof in the embodiment as shown in FIG. 2, which will not be repeated here for simplicity. Different from the embodiment as shown in FIG. 2, in the embodiment as shown in FIG. 3, on the printed circuit board 300 is further arranged a fourth processor chip 350 and a second bridge chip 360. Wherein, the fourth processor chip 350 may be a chip of the same type as the first processor chip 310, the second processor chip 320, and the third processor chip 330, and may also be a chip of different type from the first processor chip 310, the second processor chip 320, and the third processor chip 330.

In addition, the layout of the third processor chip 330 and the fourth processor chip 350 is similar to that of the first processor chip 310 and the second processor chip 320. The third processor chip is arranged on the first surface of the printed circuit board 300. The fourth processor chip 350 is arranged on the second surface of the printed circuit board 300. Part of pins of the third processor chip 330 is connected to part of pins of the fourth processor chip 350 via the second through-hole. Wherein, the "part of pins" of the third processor chip 330 and the "part of pins" of the fourth processor chip 350 are the parts of pins between the third processor chip 330 and the fourth processor chip 350 which need to be connected for realizing interaction with each other. Exemplarily, on the printed circuit board 300 may be arranged a plurality of second through-holes. The part of pins of the third processor chip 330 (connected to the fourth processor chip 350) each is connected to the respective one of the part of pins of the fourth processor chip 350 (connected to the third processor chip 330) via one second through-hole. The third processor chip 330 and the fourth processor chip 350 are connected therebetween via the pins such that transmission loss of the high speed circuit is greatly reduced.

The remaining part of pins of the third processor chip 330 (not connected to the fourth processor chip 350) and the remaining part of pins of the fourth processor chip 350 (not connected to the third processor chip 330) are all connected to the printed circuit board 300 based on a Ball Grid Array (BGA) (as shown by small circles in FIG. 3) or by use of other suitable manners.

Further, in the embodiment of the present invention, the third processor chip 330 and the fourth processor chip 350 may be arranged to completely overlap each other on the first surface and the second surface. That is to say, assuming that the first surface is a front surface of the printed circuit board 300 and the second surface is a back surface thereof, the ligature between the third processor chip 330 and the fourth processor chip 350 (if they are the same in size) is simultaneously perpendicular to the Surface A and Surface B of the printed circuit board 300, as seen from the side view of the printed circuit board 300 (i.e. the perspective as shown in FIG. 3). One advantage of doing so is that there is the shortest distance for the connection between the third processor chip 330 and the fourth processor chip 350, and the interaction and communication therebetween have the least loss. Alternatively, the third processor chip 330 and the fourth processor chip 350 may be arranged to partially overlap each other on the first surface and the second surface. Alternatively, the third processor chip 330 and the fourth processor chip 350 may also be arranged on the first surface and the second surface without overlap, which depends on the specific requirements for the layout on the printed circuit board.

In addition, since the fourth processor chip 350 and the second processor chip 320 are arranged on the same surface, they may be connected and interacted via the second bridge chip 360. The fourth processor chip 350 may be connected and interacted with the first processor chip 310 via the second processor chip 320. It is to be understood that the third processor chip 330 and the fourth processor chip 350 may interchange the position, and so do the first processor chip 310 and the second processor chip 320.

In this embodiment, on the printed circuit board are arranged four processor chips. In this case, the four processor chips may be arranged in pairs on two surfaces of the printed circuit board, and simultaneously two bridge chips are arranged such that the processor chips on the same surface are connected and interacted with each other, which can thus realize interconnection among the four processor chips (including direct connection and indirect connection) and interaction, and meanwhile save space on the printed circuit board as far as possible and reduce transmission loss of high speed circuit.

Based on the above demonstration, the printed circuit board according to embodiments of the present invention arranges multiple processor chips in pairs on different surfaces of the printed circuit board, such that the processor chips arranged on different surfaces of the printed circuit board are connected and interacted with each other via through-holes by arranging the through-holes on the printed circuit board, and the processor chips arranged on the same surface may be connected and interacted via the bridge chips or other suitable manners, which not only greatly saves the space on the printed circuit board and is beneficial to product miniaturization, but also reduces transmission loss of high speed circuit and component costs.

In addition, on the printed circuit board according to embodiments of the present invention may be further arranged other required components (e.g. on the two surfaces disposed the processor chip on the printed circuit board may be arranged one or more radiators respectively such that the processor chip on the two surfaces can better radiate heat). These components may be adaptively arranged according to the arrangement of the processor chip on the printed circuit board of the present invention, which will not be shown one by one herein.

The above exemplarily illustrates the printed circuit board according to the embodiments of the present invention.

In the following will describe, in combination with FIGS. 4-6, layout methods 400-600 of a printed circuit board provided according to another aspect of the present invention. The layout methods 400-600 of the printed circuit board in FIGS. 4-6 may be used to obtain printed circuit boards 100-300 respectively in FIGS. 1-3. Only the main steps of the layout methods 400-600 of the printed circuit board are described as below, while the detailed contents which have been described above are ignored.

Figure 4:
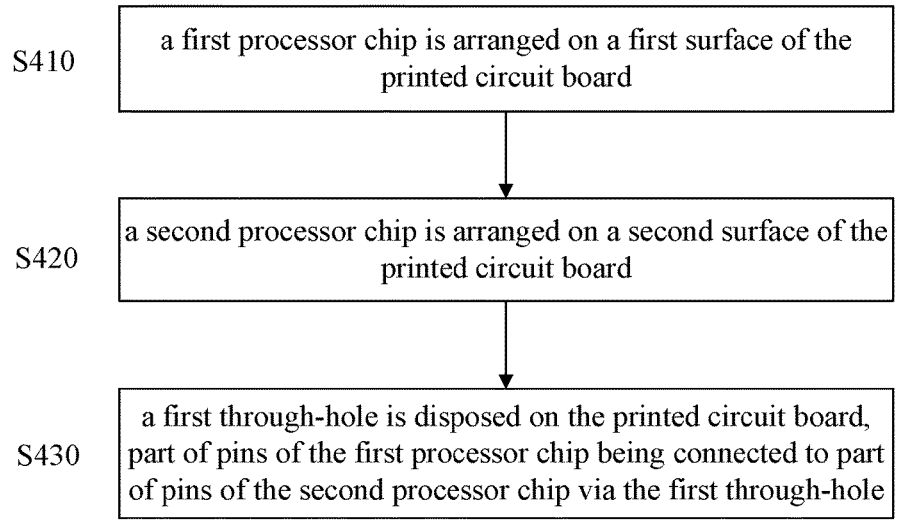
FIG. 4 illustrates an exemplary flowchart of a layout method for a printed circuit board according to one embodiment of the present invention.

FIG. 4 illustrates an exemplary flowchart of a layout method 400 of a printed circuit board according to one embodiment of the present invention. As shown in FIG. 4, the layout method 400 of the printed circuit board may comprise the following steps:

At step S410, a first processor chip is arranged on a first surface of the printed circuit board.

At step S420, a second processor chip is arranged on a second surface of the printed circuit board.

At step S430, a first through-hole is disposed on the printed circuit board, part of pins of the first processor chip being connected to part of pins of the second processor chip via the first through-hole.

In the embodiment of the present invention, when two processor chips need to be arranged on a printed circuit board, they may be arranged on different surfaces of the printed circuit board (e.g. on the front and back surfaces, referred to as front and back stacked layout technology), which therefore effectively saves space on the printed circuit board (e.g. it can save about 25%-50% space on the printed circuit board). It is beneficial for miniaturization development of the printed circuit board and even the electronic equipment comprising the same, and can also help cost down the printed circuit board and expand the range of application thereof.

In the embodiment of the present invention, the first processor chip and the second processor chip may be chips of the same type or of different types. The first processor chip and the second processor chip are connected to each other via the first through-hole provided on the printed circuit board by only using the respective parts of pins. The respective remaining parts of pins of the first processor chip and the second processor chip are all connected to the printed circuit board based on a Ball Grid Array (BGA) or by use of other suitable manners. The first processor chip and the second processor chip are arranged to be connected therebetween via the pins so that transmission loss of high speed circuit is greatly reduced, and without need of connecting to each other by use of a bridge chip as arranged on the conventional printed circuit board, such a component as the bridge chip is not required to be arranged on the printed circuit board provided with two processor chips, thereby reducing the component cost.

Further, upon arrangement of the first processor chip and the second processor chip in steps S410 and S420, the first processor chip and the second processor chip may be further arranged to completely overlap each other on the first surface and the second surface of the printed circuit board. That is to say, the ligature between the first processor chip and the second processor chip (if they are the same in size) is simultaneously perpendicular to the first surface and the second surface of the printed circuit board, as seen from the side view of the printed circuit board. One advantage of doing so is that there is the shortest distance for the connection between the first processor chip and the second processor chip, and the interaction and communication therebetween have the least loss. Alternatively, upon arrangement of the first processor chip and the second processor chip in steps S410 and S420, the first processor chip and the second processor chip may be further arranged to partially overlap each other on the first surface and the second surface. Alternatively, the first processor chip and the second processor chip may be arranged on the first surface and the second surface without overlap, which depends on the specific requirements for the layout on the printed circuit board.

Based on the above demonstration, the layout method of the printed circuit board according to embodiments of the present invention arranges two processor chips on different surfaces of the printed circuit board and enable the respective parts of pins of the two processor chips to pass through the printed circuit board to be connected to each other by disposing through-holes on the printed circuit board, which not only greatly saves the space on the printed circuit board and is beneficial to product miniaturization, but also reduces transmission loss of high speed circuit and component costs.

Figure 5:
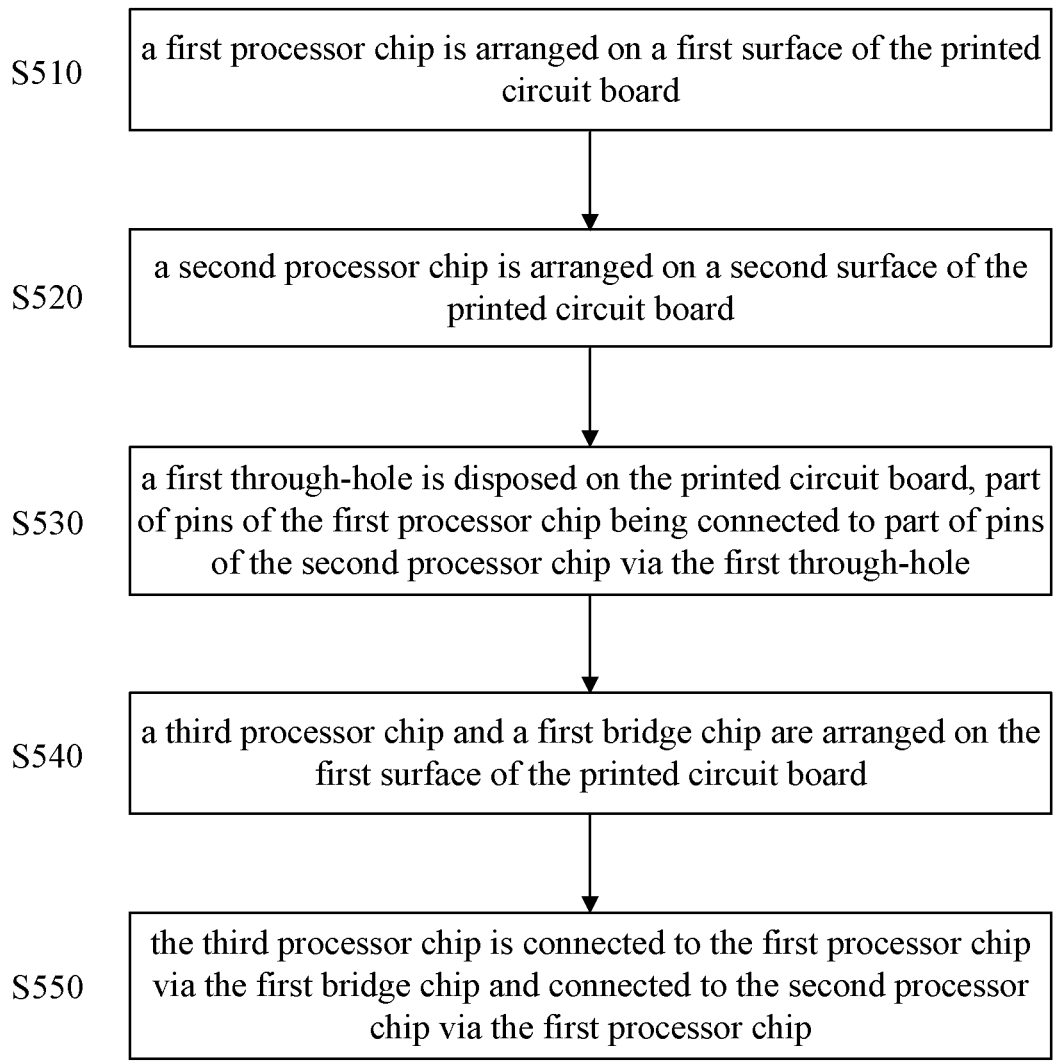
FIG. 5 illustrates an exemplary flowchart of a layout method for a printed circuit board according to another embodiment of the present invention.

FIG. 5 illustrates an exemplary flowchart of a layout method 500 of a printed circuit board according to another embodiment of the present invention. As shown in FIG. 5, the layout method 500 of the printed circuit board may comprise the following steps:

At step S510, a first processor chip is arranged on a first surface of the printed circuit board.

At step S520, a second processor chip is arranged on a second surface of the printed circuit board.

At step S530, a first through-hole is disposed on the printed circuit board, part of pins of the first processor chip being connected to part of pins of the second processor chip via the first through-hole.

At step S540, a third processor chip and a first bridge chip are arranged on the first surface of the printed circuit board.

At step S550, the third processor chip is connected to the first processor chip via the first bridge chip and connected to the second processor chip via the first processor chip.

The steps S510, S520 and S530 in the layout method 500 of the printed circuit board depicted with reference to FIG. 5 according to embodiments of the present invention are respectively similar to the steps S410, S420 and S430 in the layout method 400 of the printed circuit board depicted with reference to FIG. 4 according to embodiments of the present invention, which will not be repeated here for simplicity. Different from the layout method 400 of the printed circuit board depicted with reference to FIG. 4 according to embodiments of the present invention, the layout method 500 of the printed circuit board depicted with reference to FIG. 5 according to embodiments of the present invention further comprises the steps S540 and S550. That is to say, in the layout method 500 of the printed circuit board depicted with reference to FIG. 5 according to embodiments of the present invention, on the printed circuit board are arranged three processor chips. The step S540 to step S550 depicts the layout of the third processor chip as well as the layout in relation to the connection and interaction of the third processor chip with the first and second processor chips.

Wherein, the third processor chip may be a chip of the same type as the first processor chip and the second processor chip, and may also be a chip of different type from the first processor chip and the second processor chip. In the layout method 500 of the printed circuit board, the third processor chip and the first bridge chip are arranged on the first surface of the printed circuit board such that the third processor chip is connected and interacted with the first processor chip via the first bridge chip, and connected and interacted with the second processor chip via the first processor chip. It is herein to be understood that the third processor chip may also be arranged on a second surface of the printed circuit board, and the first bridge chip is simultaneously arranged on the second surface of the printed circuit board. In this way, the third processor chip is connected and interacted with the second processor chip via the first bridge chip and connected and interacted with the first processor chip via the second processor chip.

In this embodiment, on the printed circuit board are arranged three processor chips. In this case, two processor chips may be arranged on two surfaces of the printed circuit board, and simultaneously another one processor chip is arranged on the surface on which any one of the previous two processor chips is arranged. Meanwhile, the bridge chip is arranged to be connected and interacted with the processor chip on the same surface, which can thus realize interconnection among the three processor chips (including direct connection and indirect connection) and interaction, and save space on the printed circuit board as far as possible and reduce transmission loss of high speed circuit. The layout scheme as shown in FIG. 5 may be used in the scenario where on the printed circuit board are arranged more than two processor chips and with odd numbers.

Figure 6:
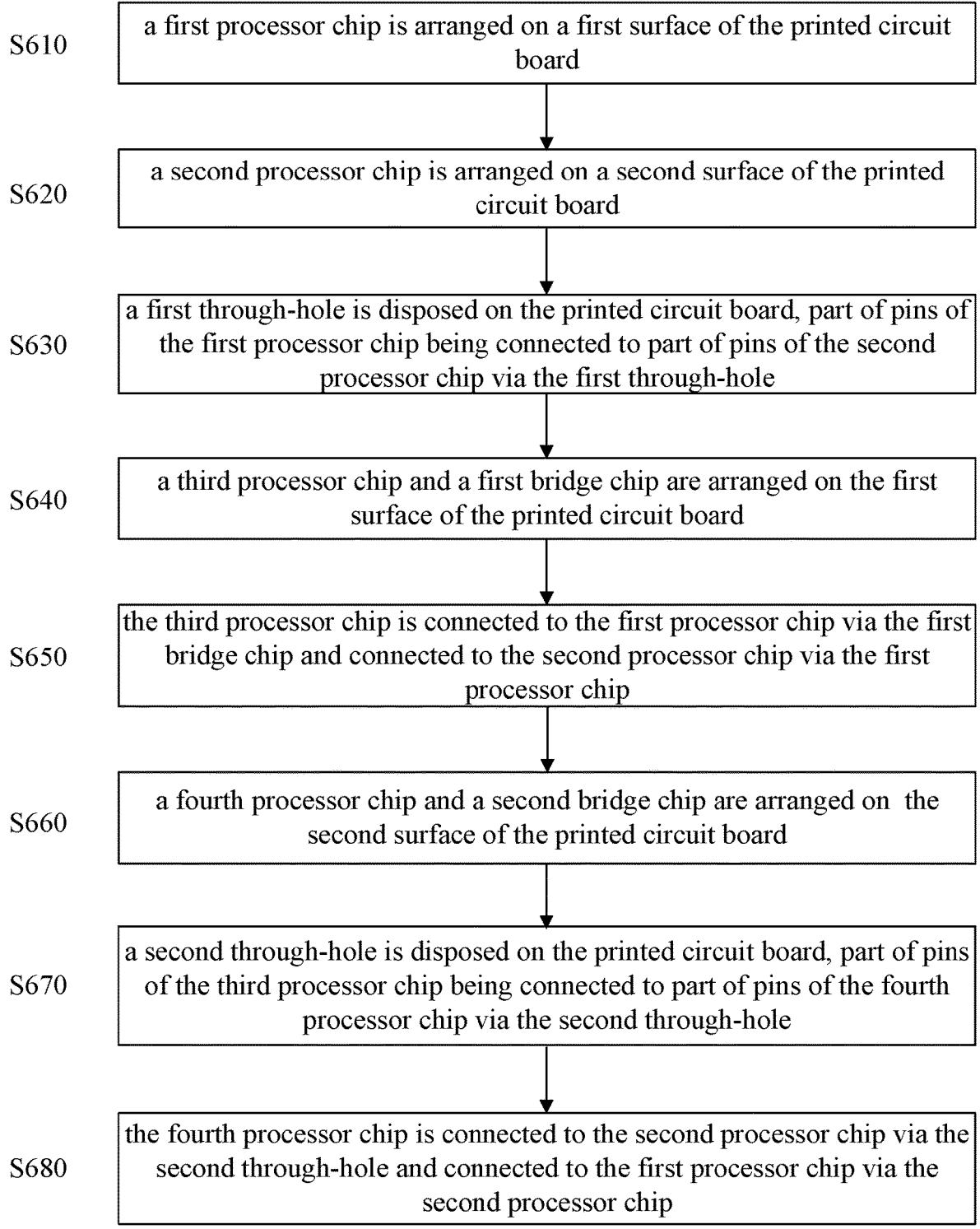
FIG. 6 illustrates an exemplary flowchart of a layout method for a printed circuit board according to still another embodiment of the present invention.

FIG. 6 illustrates an exemplary flowchart of a layout method 600 of a printed circuit board according to still another embodiment of the present invention. As shown in FIG. 6, the layout method 600 of the printed circuit board may comprise the following steps:

At step S610, a first processor chip is arranged on a first surface of the printed circuit board.

At step S620, a second processor chip is arranged on a second surface of the printed circuit board.

At step S630, a first through-hole is disposed on the printed circuit board, part of pins of the first processor chip being connected to part of pins of the second processor chip via the first through-hole.

At step S640, a third processor chip and a first bridge chip are arranged on the first surface of the printed circuit board.

At step S650, the third processor chip is connected to the first processor chip via the first bridge chip and connected to the second processor chip via the first processor chip.

At step S660, a fourth processor chip and a second bridge chip are arranged on the second surface of the printed circuit board.

At step S670, a second through-hole is disposed on the printed circuit board, part of pins of the third processor chip being connected to part of pins of the fourth processor chip via the second through-hole.

At step S680, the fourth processor chip is connected to the second processor chip via the second through-hole and connected to the first processor chip via the second processor chip.

The steps S610, S620, S630, S640 and S650 in the layout method 600 of the printed circuit board depicted with reference to FIG. 6 according to embodiments of the present invention are respectively similar to the steps S510, S520, S530, S540 and S550 in the layout method 500 of the printed circuit board depicted with reference to FIG. 5 according to embodiments of the present invention, which will not be repeated here for simplicity. Different from the layout method 500 of the printed circuit board depicted with reference to FIG. 5 according to embodiments of the present invention, the layout method 600 of the printed circuit board depicted with reference to FIG. 6 according to embodiments of the present invention further comprises the steps S660, S670 and S680. That is to say, in the layout method 600 of the printed circuit board depicted with reference to FIG. 6 according to embodiments of the present invention, on the printed circuit board are arranged four processor chips. The step S660 to step S680 depicts the layout of the fourth processor chip as well as the layout in relation to the connection and interaction of the fourth processor chip with the first, the second, and the third processor chips.

Wherein, the fourth processor chip may be a chip of the same type as the first processor chip, the second processor chip and the third processor chip, and may also be a chip of different type from the first processor chip, the second processor chip and the third processor chip. In the layout method 600 of the printed circuit board, the first processor chip, the third processor chip and the first bridge chip are arranged on the first surface of the printed circuit board, and the second processor chip, the fourth processor chip and the second bridge chip are arranged on the second surface of the printed circuit board. The first processor chip and the second processor chip are connected to each other by the respective parts of pins via the first through-hole on the printed circuit board. The third processor chip and the fourth processor chip are connected to each other by the respective parts of pins via the second through-hole on the printed circuit board. The first processor chip is connected to the third processor chip via the first bridge chip. The second processor chip is connected to the fourth processor chip via the second bridge chip. The first processor chip is connected to fourth processor chip via the second processor chip or the third processor chip. The second processor chip is connected to the third processor chip via the first processor chip or the fourth processor chip. It is to be understood that the third processor chip and the fourth processor chip may interchange the position, and so do the first processor chip and the second processor chip.

In this embodiment, on the printed circuit board are arranged four processor chips. In this case, the four processor chips may be arranged in pairs on two surfaces of the printed circuit board, and simultaneously two bridge chips are arranged such that the processor chips on the same surface are connected and interacted with each other, which can thus realize interconnection among the four processor chips (including direct connection and indirect connection) and interaction, and meanwhile save space on the printed circuit board as far as possible and reduce transmission loss of high speed circuit. The layout scheme as shown in FIG. 6 may be used in the scenario where on the printed circuit board are arranged more than two processor chips and with even numbers.

In addition, an electronic equipment is further provided according to embodiments of the present invention. The electronic equipment may comprise a printed circuit board described in the context according to the embodiments of the present invention. Those skilled in the art would appreciate the structure of the electronic equipment based on the printed circuit board described in the text according to the embodiments of the present invention, which will not be repeated here for simplicity.

Based on the above demonstration, the printed circuit board and the layout method thereof according to embodiments of the present invention arrange multiple processor chips in pairs on different surfaces of the printed circuit board, such that the processor chips arranged on different surfaces of the printed circuit board are connected and interacted with each other via through-holes by arranging the through-holes on the printed circuit board, and the processor chips arranged on the same surface may be connected and interacted via the bridge chips or other suitable manners, which not only greatly saves the space on the printed circuit board and is beneficial to product miniaturization, but also reduces transmission loss of high speed circuit and component costs.

Although the above example embodiments have been described with reference to the drawings, it is to be understood that the above-described example embodiments are for illustrative purposes only and are not intended to limit the scope of the invention thereto. Those of ordinary skill in the art can make various variations and modifications therein but not deviate from the scope and spirit of the present invention. All these variations and modifications are intended to be included within the scope of the invention as claimed by the claims attached.

Those of ordinary skill in the art may be aware that units and algorithmic steps of respective examples described in the embodiments disclosed in the context can be realized in conjunction with an electronic hardware, or a computer software and the electronic hardware. Whether these functions are implemented in a manner of hardware or software depends on the specific application and design constraint conditions of the technical solution. The technical professionals may realize the described function of each specific application using different methods; however such realization should not be deemed as exceeding the scope of the present invention.

Numerous specific details are set forth in the description provided herein. However, it can be understood that the embodiments of the present invention may be practiced without these specific details. The well-known method, structure and technique are not illustrated in detail in some examples so as not to confuse the understanding on this description.

Similarly, it is to be understood that respective features of the present invention are sometimes grouped together to the single embodiment, the drawing, or the depiction thereof in the description of the exemplary embodiments of the present invention, in order to simplify the present invention and facilitate understanding of one or more aspects of the invention. However, the method of the present invention shall not be explained to reflect the following intention, that is, the claimed present invention claims more features than those explicitly recited in each claim. To be more accurate, as reflected by the corresponding claims, the inventive ideas thereof lie in that the corresponding technical problem may be resolved with the feature fewer than all features of the single embodiment of some disclosure. Thus, the claims complying with the embodiments are hereby explicitly incorporated into the embodiments, wherein each claim itself serves as an independent embodiment of the present invention.

It would be understood by those skilled in the art that, any combination, except the mutually exclusive features therebetween, may be used to combine all features disclosed in this description (including the claims, abstract and accompanying drawings that follow) and any method disclosed hereby or all processes or units of the equipment. Each feature disclosed in this description (including the claims, abstract and accompanying drawings that follow) may be replaced with the alternative features which provide the same, equivalent or similar purposes unless otherwise explicitly represented.

In addition, it would be understood by those skilled in the art that although some embodiments described herein comprise some features that are included in other embodiments but not other features, the combination of the features of different embodiments means falling into the scope of the present invention and forming different embodiments. For example, in the claims, any one of the claimed embodiments may be used in a manner of an arbitrary combination.

Described above are only embodiments of the present invention or explanation for the embodiments; however the protection scope of the invention is not limited thereto. Any technicians who are familiar with the art would readily envisage that, within the technical scope disclosed in the invention, variations or alternatives shall all be covered in the protection scope of the invention. The protection scope of the invention shall be defined by that of the claims.

What is claimed is:

1. A printed circuit board, comprising:
a first processor chip, a second processor chip, a third processor chip, a fourth processor chip, a first bridge chip, and a second bridge chip arranged on the printed circuit board, wherein:
the first processor chip is arranged on a first surface of the printed circuit board;
the second processor chip is arranged on a second surface of the printed circuit board;
a first through-hole is disposed on the printed circuit board, with part of pins of the first processor chip being connected to part of pins of the second processor chip via the first through-hole;
the third processor chip and the first bridge chip are arranged on the first surface of the printed circuit board;
the third processor chip is connected to the first processor chip via the first bridge chip and connected to the second processor chip via the first processor chip;
the fourth processor chip and the second bridge chip are arranged on the second surface of the printed circuit board;
a second through-hole is disposed on the printed circuit board, part of pins of the third processor chip being connected to part of pins of the fourth processor chip via the second through-hole;
the fourth processor chip is connected to the second processor chip via the second bridge chip and connected to the first processor chip via the second processor chip.

2. The printed circuit board of claim 1, wherein the first processor chip and the second processor chip are arranged to overlap each other on the first surface and the second surface.

3. The printed circuit board of claim 1, wherein the first processor chip and the second processor chip are chips of the same type.

4. The printed circuit board of claim 3, wherein the first processor chip and the second processor chip are both central processing unit chips, or the first processor chip and the second processor chip are both graphics processing unit chips.

5. The printed circuit board of claim 1, wherein the first processor chip and the second processor chip are chips of different types.

6. The printed circuit board of claim 5, wherein one of the first processor chip and the second processor chip is a central processing unit chip, and the other is a graphics processing unit chip.

7. The printed circuit board of claim 1, wherein the remaining part of pins of the first processor chip and the remaining part of pins of the second processor chip are both connected to the printed circuit board based on a Ball Grid Array.

8. A layout method of a printed circuit board, comprising:
   arranging a first processor chip on a first surface of the printed circuit board;
   arranging a second processor chip on a second surface of the printed circuit board;
   disposing a first through-hole on the printed circuit board, with part of pins of the first processor chip being connected to part of pins of the second processor chip via the first through-hole;
   arranging a third processor chip and a first bridge chip on the first surface of the printed circuit board;
   connecting the third processor chip to the first processor chip via the first bridge chip and to the second processor chip via the first processor chip;
   arranging a fourth processor chip and a second bridge chip on the second surface of the printed circuit board;
   disposing a second through-hole on the printed circuit board, part of pins of the third processor chip being connected to part of pins of the fourth processor chip via the second through-hole;
   connecting the fourth processor chip to the second processor chip via the second bridge chip and to the first processor chip via the second processor chip.

9. The layout method of claim 8, wherein the layout method further comprises:
   arranging the first processor chip and the second processor chip to overlap each other on the first surface and the second surface.

10. The layout method of claim 8, wherein the layout method further comprises:
    the remaining part of pins of the first processor chip and the remaining part of pins of the second processor chip are both configured to be connected to the printed circuit board based on a Ball Grid Array.

11. An electronic equipment device, comprising:
    a printed circuit board; and
    a first processor chip, a second processor chip, a third processor chip, a fourth processor chip, a first bridge chip, and a second bridge chip arranged on the printed circuit board, wherein:
    the first processor chip is arranged on a first surface of the printed circuit board;
    the second processor chip is arranged on a second surface of the printed circuit board;
    a first through-hole is disposed on the printed circuit board, with part of pins of the first processor chip being connected to part of pins of the second processor chip via the first through-hole;
    the third processor chip and the first bridge chip are arranged on the first surface of the printed circuit board;
    the third processor chip is connected to the first processor chip via the first bridge chip and connected to the second processor chip via the first processor chip;
    the fourth processor chip and the second bridge chip are arranged on the second surface of the printed circuit board;
    a second through-hole is disposed on the printed circuit board, part of pins of the third processor chip being connected to part of pins of the fourth processor chip via the second through-hole;
    the fourth processor chip is connected to the second processor chip via the second bridge chip and connected to the first processor chip via the second processor chip.

* * * * *